United States Patent [19]
Oppold et al.

[11] Patent Number: 5,737,270
[45] Date of Patent: Apr. 7, 1998

[54] PRECHARGED WORDLINE DECODER WITH LOCALLY-CONTROLLED CLOCK

[75] Inventors: Jeffery H. Oppold, Richmond; Michael R. Ouellette, Westford; James A. Svarczkopf, Essex Junction; Daved J. Wager, Jeffersonville, all of Vt.

[73] Assignee: International Business Machines Corporation, Armonk, N.Y.

[21] Appl. No.: 680,081

[22] Filed: Jul. 15, 1996

[51] Int. Cl.$^6$ ........................................ G11C 8/00
[52] U.S. Cl. ............... 365/203; 365/230.06; 326/106
[58] Field of Search .......................... 365/203, 230.06, 365/230.08, 233; 326/106, 105

[56] References Cited

U.S. PATENT DOCUMENTS

| | | | |
|---|---|---|---|
| 4,360,902 | 11/1982 | Proebsting | 365/230.06 |
| 4,381,460 | 4/1983 | Menachem | 307/449 |
| 4,401,903 | 8/1983 | Iizuka | 307/449 |
| 4,581,548 | 4/1986 | Young | 307/449 |
| 4,614,883 | 9/1986 | Sood et al. | 307/449 |
| 4,700,086 | 10/1987 | Ling et al. | 307/443 |
| 4,833,348 | 5/1989 | Hannai | 307/449 |
| 5,001,367 | 3/1991 | Vinal | 307/448 |
| 5,291,076 | 3/1994 | Bridges et al. | 307/449 |
| 5,373,203 | 12/1994 | Nicholes et al. | 326/106 |
| 5,598,375 | 1/1997 | Yang | 365/230.06 |

FOREIGN PATENT DOCUMENTS 0068795   4/1986   Japan ................ 365/230.06

*Primary Examiner*—David C. Nelms
*Assistant Examiner*—Son Mai
*Attorney, Agent, or Firm*—Schmeiser, Olsen & Watts; Robert A. Walsh

[57] ABSTRACT

A precharge wordline decoder is disclosed that comprises a first logic circuit that receives a first clock signal from a clock driver for enabling the discharge element within the first logic circuit. The wordline decoder further comprises a delay circuit for generating a predetermined delayed clock signal from the first clock signal, the delayed clock signal being locally-controlled. A second logic circuit of the wordline decoder receives the delayed clock signal for controlling wordline driver elements. The first logic circuit also receives the delayed clock signal for disabling the precharge elements of the decoder.

18 Claims, 4 Drawing Sheets

PRECHARGED WORDLINE DECODER WITH LOCALLY-CONTROLLED CLOCK

BACKGROUND OF THE INVENTION

1. Technical Field

The invention relates generally to decoders, and more specifically, to precharge-type memory address decoders.

2. Background Art

A fundamental component of any memory is the decoder circuit. In general, decoder circuits output a unique signal if and only if all of the bits of an input correspond to a predetermined set of values. Thus, a decoder circuit for a memory enables a particular wordline in a matrix of memory cells if an input memory address matches the predetermined address of a line of memory cells to which the decoder is connected. One way of verifying whether or not the input address corresponds with the predetermined address is through the use of a precharge-type decoder circuit. A precharge-type decoder uses precharge devices, which will only generate an output when specific inputs are applied.

Some examples of precharge-type decoder circuits include: U.S. Pat. No. 5,291,076, "Decoder/Comparator and Method of Operation", issued March 1994 to Bridges et al.; U.S. Pat. No. 5,373,203, "Decoder and Latching Circuit with Differential Outputs", issued December 1994 to Nicholes et al.; and U.S. Pat. No. 4,581,548, "Address Decoder", issued Apr. 8, 1986 to Young. The above-mentioned patents disclose precharge-type decoders that use one clock to activate several circuits, such as a NOR decoder circuit and an output driver circuit. Although activating these circuits simultaneously, as done therein, provide a high decoder performance, the patents are limited to memories where signal glitches can be tolerated as an increase in path delay. On the other hand, in memories such as static random access memories (SRAMs), a signal glitch could cause several wordlines to be selected, ending in faulty data and damaging results.

To solve the problem of signal glitches, delays were built into the decoder circuits, thus activating the various circuit components in stages. U.S. Pat. No. 4,401,903, "MOS Decoder Circuit", issued August 1983 to Iizuka describes a decoder that uses one clock to activate an input circuit, which when discharged will enable a second circuit. One disadvantage of using the precharged circuitry to generate the delay is that the delay is based on the circuit's rate of discharge, which ultimately may slow down the performance of the decoder. Furthermore, using only one clock to drive a number of circuits increases the input capacitance, causing the clock to drive harder and possibly more slower.

Accordingly, a need has developed in the art for a precharged wordline decoder that will use a reasonable delay in preventing the possibility of glitches while keeping a generally low capacitance clock signal.

SUMMARY OF THE INVENTION

It is thus an advantage of the present invention to provide a precharged wordline decoder that implements a reasonable delay while keeping a generally low capacitance clock signal.

The foregoing and other advantages of the invention are realized by a wordline decoder comprising a first logic circuit (a precharged NOR) that receives a first clock signal from a clock driver. The first clock signal enables a discharge element within the first logic circuit. The wordline decoder further comprises a delay circuit for generating a predetermined delayed clock signal from the first clock signal, the delayed clock signal being locally-controlled; and a second logic circuit (a precharged NAND) that receives the delayed clock signal for controlling wordline driver elements. The first logic circuit also receives the delayed clock signal for disabling the precharge elements of the decoder. The first clock signal may be a generally low capacitance signal because of the generation and operation of a second, delayed clock signal.

The foregoing and other objects, features, and advantages of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
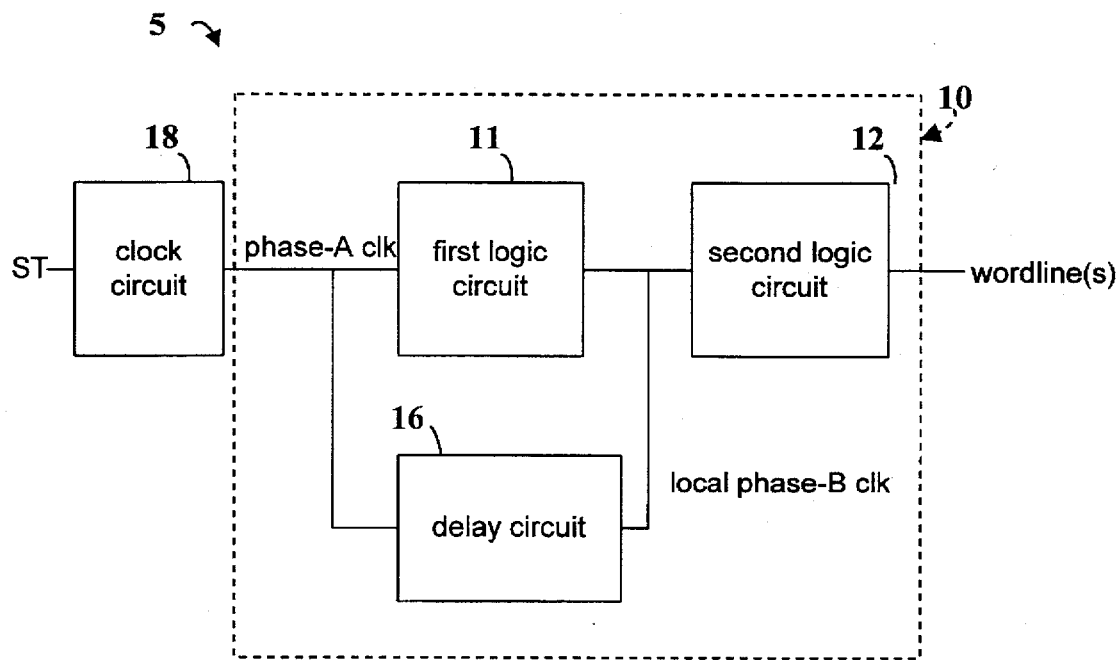
FIG. 1 is a block diagram of a precharged decoder system in accordance with a preferred embodiment of the present invention.

Referring to FIG. 1, a decoder system 5 including a clock circuit 18 and at least one precharged wordline decoder circuit 10 having precharge elements and wordline driver elements (discussed in more detail in reference to FIGS. 3–5) in accordance with the present invention is disclosed. The wordline decoder circuit 10 comprises a first logic circuit 11, a second logic circuit 12, and a delay circuit 14 and 15. The clock circuit 18 of the decoder system 5 receives a pulse signal ST and generates a first clock signal (phase-A clk) from the pulse signal. The pulse signal corresponds to a memory's internal signal, ST being specifically related to an SRAM, but not limited to such. The first clock signal is then received by the first logic circuit 11 of the decoder circuit 10. The first clock signal enables a discharge element within the first logic circuit as detailed below. The delay circuit 16 generates a predetermined delayed clock signal (local phase-B clk), which is locally-controlled (i.e., each decoder circuit of decoder system 5 determines its phase-B clk delay, without regard for memory array size). The second logic circuit 12, which controls the wordline elements as detailed below, receives the delayed clock signal and outputs a wordline if the address bits of the input correspond to that specific wordline. The delayed clock signal is also received by the first logic circuit for disabling the precharge elements of the decoder.

Figure 2:
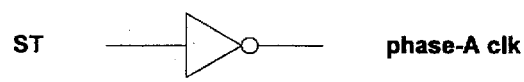
FIG. 2 is a circuit diagram of the clock circuit of FIG. 1.

As seen in FIG. 2, the clock circuit of FIG. 1 comprises a single inverter 18. As aforementioned, the pulse signal ST is related to an SRAM internal signal. Although the invention is not limited to SRAMs, the invention does successfully deal with the damaging effects signal glitches have on SRAMs. Furthermore, since the clock delay (phase-A clk) of a decoder system may vary greatly with the array size of a compilable SRAM, a locally-controlled clock signal, such as disclosed with the present invention, still guarantees an acceptable separation delay between phase-A clk and phase-B clk.

Figure 3:
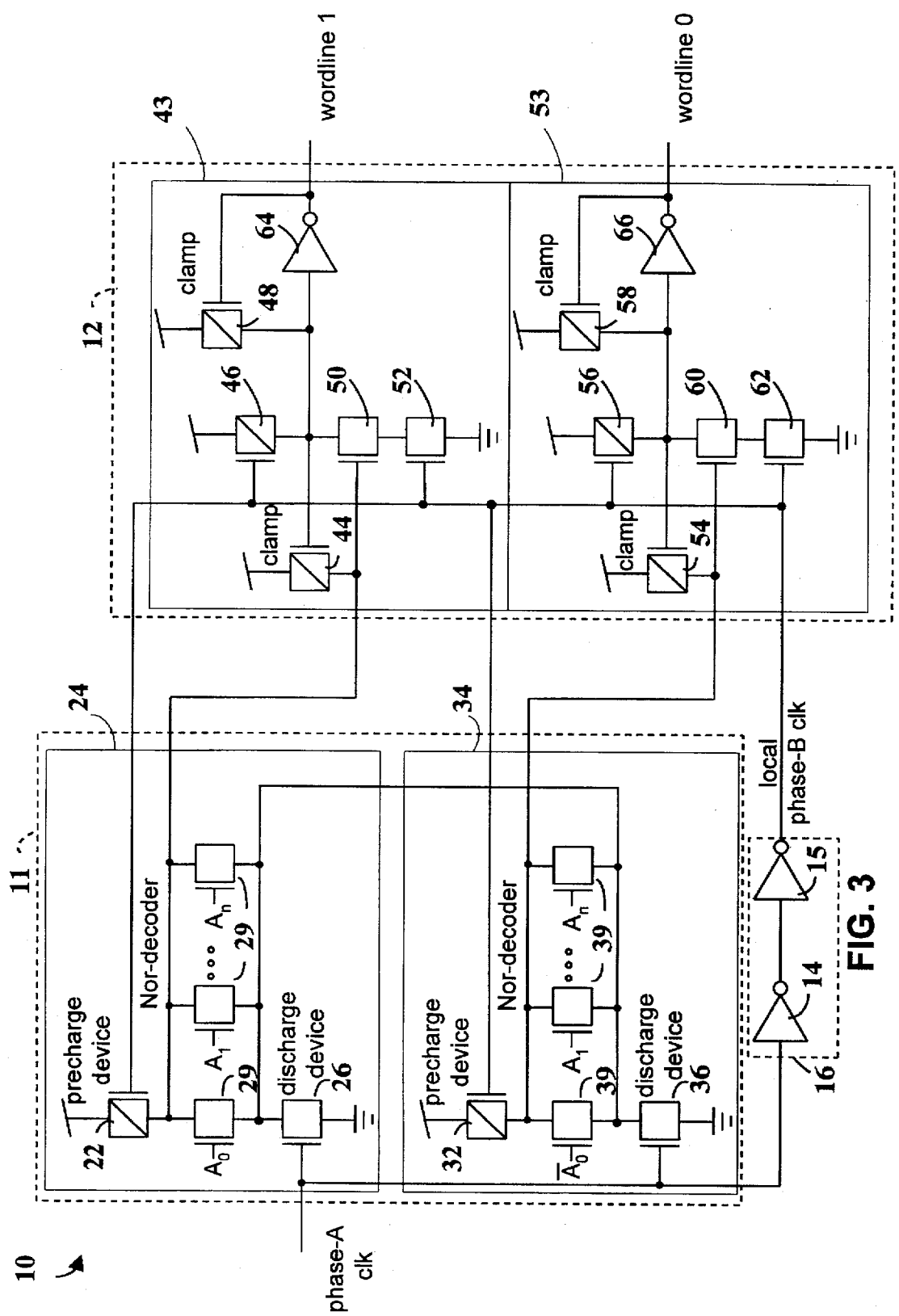
FIG. 3 is a circuit diagram illustrating a preferred embodiment of the precharged decoder circuit of FIG. 1.
Figure 4:
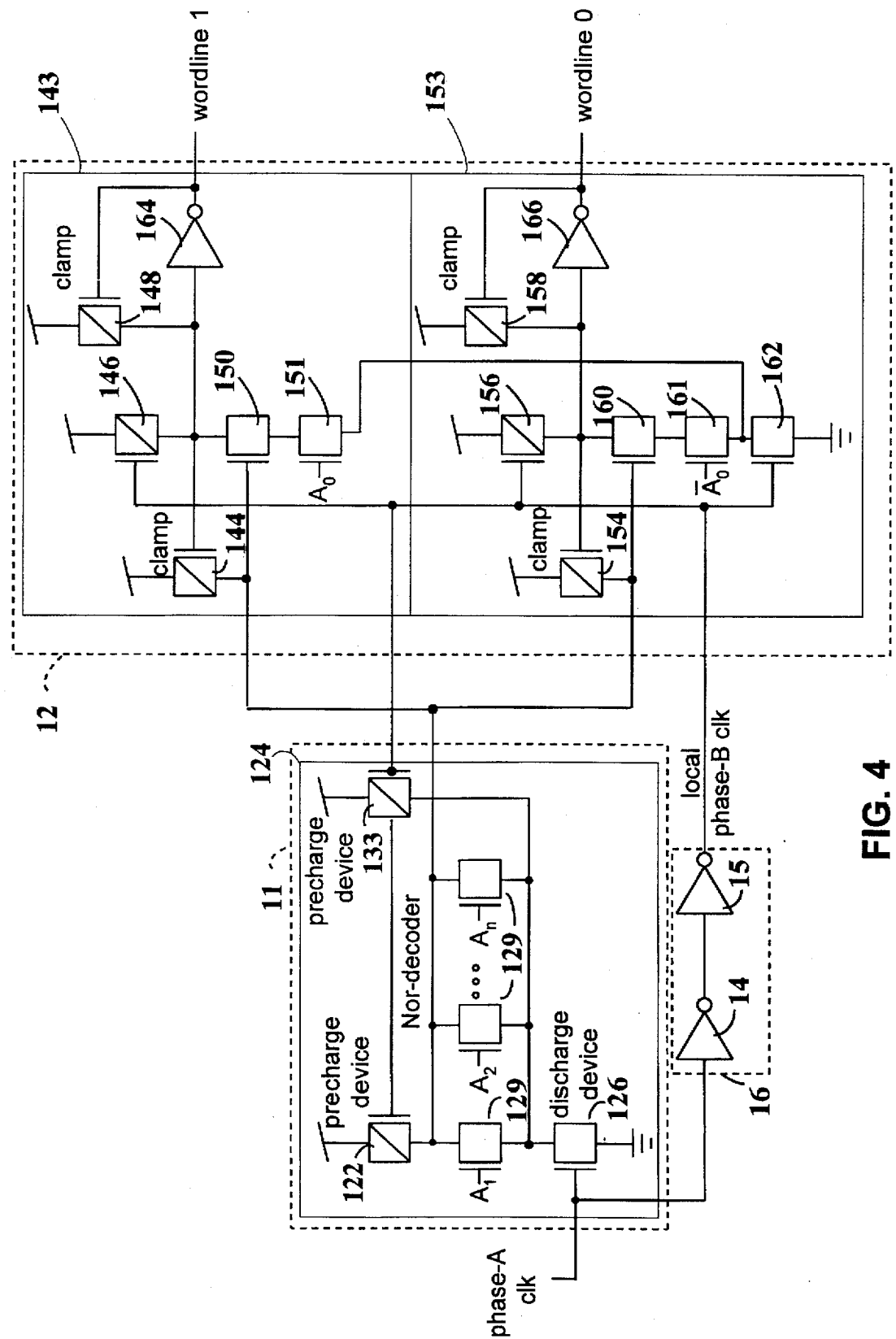
FIG. 4 is a circuit diagram illustrating a second embodiment of the precharged decoder circuit of FIG. 1.
Figure 5:
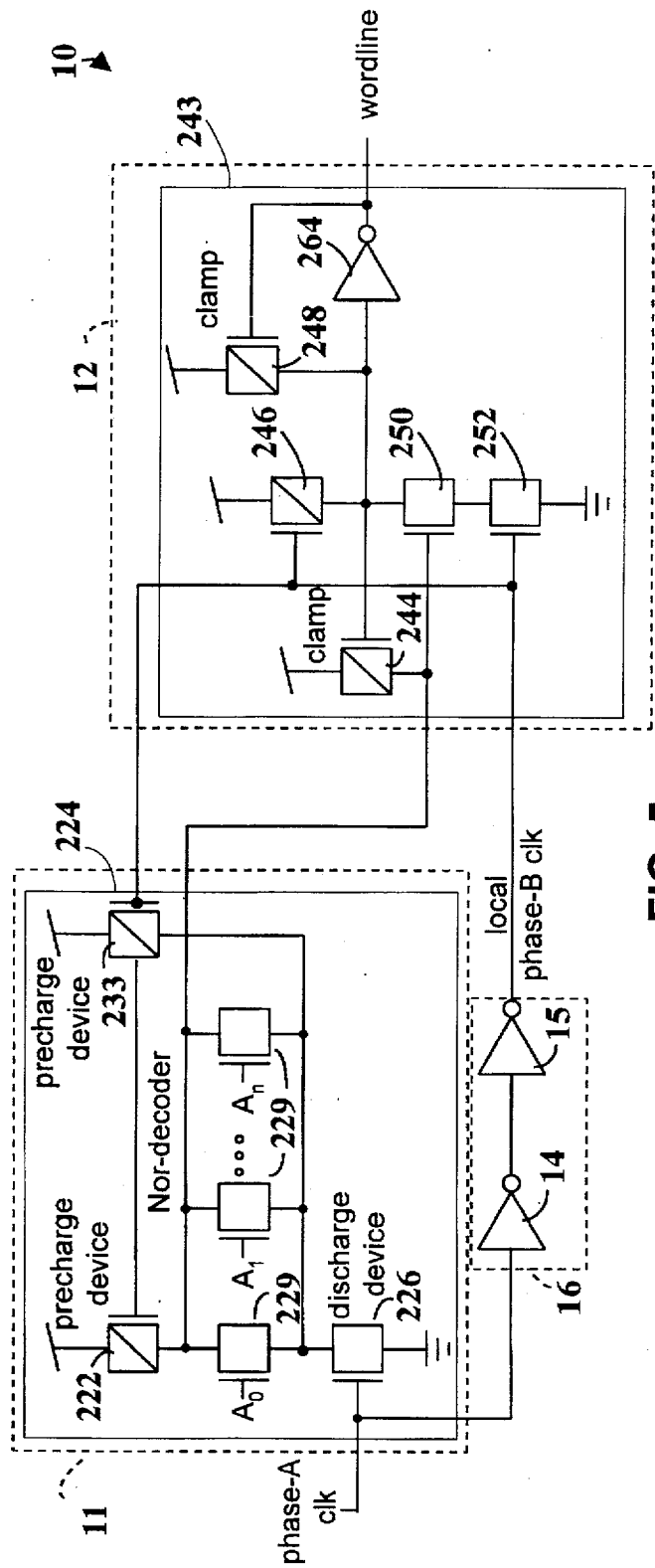
FIG. 5 is a circuit diagram of a third embodiment of the precharged decoder circuit of FIG. 1.

As shown in FIGS. 3–5, the first logic circuit 11 comprises at least one precharged NOR decoder circuit, and the second logic circuit 12 comprises at least one precharged NAND wordline driver circuit. FIG. 3 discloses two NOR decoder circuits corresponding to two wordline driver circuits. FIG. 4 discloses one NOR decoder circuit corresponding to two wordline driver circuits. FIG. 5 discloses one NOR decoder circuit corresponding to one wordline driver circuit. Each embodiment uses address bits $A_0$–$A_n$ in selecting the proper decoder and wordline in decoder system 5, and, depending on the ratio of NOR decoder circuits to NAND wordline driver circuits, will either enhance the access time (FIG. 3) or the setup time (FIG. 4) as herein described below.

As shown in FIG. 3, the first logic circuit 11 is made up of two precharged NOR decoder circuits 24 and 34, and the second logic circuit 12 comprises two wordline drivers 43 and 53. NOR decoder circuit 24 comprises parallel coupled NOR gate n-channel field-effect transistors (NFETs) 29, with inputs $A_0$–$A_n$, a p-channel field-effect transistor (PFET) precharge device 22 coupled on one side of transistors 29, and an NFET discharge device 26 coupled on the opposite side of transistors 29. Phase-A clk provides an input into the gate of discharge device 26. As with most precharged devices, unless otherwise specified, ground is the input into the source of discharge device 26 and VCC is the input into the source of precharge device 22.

Similarly, NOR decoder circuit 34 comprises parallel coupled NOR gate NFETs 39, with inputs $A_0$–$A_n$, a PFET precharge device 32 coupled on one side of transistors 39, and an NFET discharge device 36 coupled on the opposite side of transistors 39. Phase-A clk provides an input into the gate of discharge device 36.

Phase-A clk also provides an input into delay circuit 16. Delay circuit 16, comprising two inverters 14 and 15 coupled in series, generates the local phase-B clk from the phase-A clk.

Wordline driver circuit 43 comprises a two-input precharged NAND device with a PFET precharge device 46 coupled on one side of transistor 50 and an NFET discharge device 52 coupled on the other side of transistor 50. The gate of transistor 50 is coupled to the output of transistors 29. The drain of transistor 50 is coupled to inverter 64, which outputs wordline 1. PFET clamp devices 44 and 48 regulate the gate voltages at transistor 50 and inverter 64, respectively. The clamp devices are used to hold the output node of each clamp device at a high voltage level, thereby preventing the decoder circuit from misdecoding due to a drop in the voltage level at the output node of the clamp devices. The gates of precharge device 46, and discharge device 52 are coupled to the gates of precharge devices 22, 32, and 56, discharge device 62, and the local phase-B clk.

Similarly, wordline driver circuit 53 comprises a precharged NAND device with a PFET precharge device 56 coupled on one side of transistor 60 and an NFET discharge device 62 coupled on the other side of transistor 60. The gate of transistor 60 is coupled to the output of transistors 39. The drain of transistor 60 is coupled to inverter 66, which outputs wordline 0. PFET clamp devices 54 and 58 regulate the voltages at transistor 60 and inverter 66, respectively.

As aforementioned, the embodiment of the invention as shown in FIG. 3 is oriented towards enhancing the access time of the circuit. The NOR decoders correspond to the wordline drivers in a one-to-one relationship thus allowing for a faster access time than, for example, the circuit as shown in FIG. 4.

As depicted in FIG. 4, the first logic circuit 11 is made up of one precharged NOR decoder circuit 124, and the second logic circuit 12 comprises two wordline drivers 143 and 153. NOR decoder circuit 124 comprises parallel coupled NOR gate NFETs 129, with inputs $A_1$–$A_n$, a PFET precharge device 122 coupled on one side of transistors 129, and an NFET discharge device 126 coupled on the opposite side of transistors 129. Phase-A clk provides an input into the gate of discharge device 126. The drain of a second precharge device 133 is connected to the drain of the discharge device, and the gate of precharge device 133 is connected to the gate of precharge device 122. Although precharge device 133 is disclosed in FIG. 4 (and similarly, precharge device 233 in FIG. 5), the precharge device 133 (and 233 of FIG. 5) may be removed without affecting the operability of the circuit. Precharge device 133 (and 233 of FIG. 5) merely provides a point of reference for the predictability of the circuit delay.

As in FIG. 3, the phase-A clk provides an input into delay circuit 16. Delay circuit 16, comprising two inverters 14 and 15 coupled in series, generates the local phase-B clk from the phase-A clk.

Wordline driver circuits 143 and 153 of FIG. 4 are similar in structure to wordline driver circuits 43 and 53 of FIG. 3. Elements 144–166 correspond to and are connected the same as elements 44–66 of FIG. 3 with a couple of exceptions. The exceptions are as follows: first, the wordline driver circuits of FIG. 4 connect to only one NOR decoder circuit instead of two, and thus share the same transistors 129 and precharge device 122; and second, the precharged NAND devices of FIG. 4 are three-input NAND devices instead of two-input NAND devices. The three-input NAND devices consist of transistors 150 and 151 for wordline driver circuit 143, and transistors 160 and 161 for wordline driver circuit 153. Address bit $A_0$ inputs into the gate of transistor 151, and the inverse of address bit $A_0$ is the input into the gate of transistor 161. The source of transistor 151 is coupled to the drain of discharge device 162, and the drain of transistor 151 is coupled to the source of transistor 150. Likewise, the source of transistor 161 is coupled to the drain of discharge device 162, and the drain of transistor 161 is coupled to the source of transistor 160. Thus, instead of using two discharge devices for the wordline drivers, as in FIG. 3, both wordline driver circuits share discharge device 162, as shown in FIG. 4. The use of one NOR circuit for two wordline drivers reduces the capacitance of $A_1$–$A_n$, thus allowing for a faster address setup time.

As depicted in FIG. 5, the first logic circuit 11 is made up of one precharged NOR decoder circuit 224, and the second logic circuit 12 comprises one wordline driver 243. NOR decoder circuit 224 is the same in structure as NOR decoder circuit 124 of FIG. 4, with elements 222–229 of FIG. 5 corresponding to elements 122–129 of FIG. 4. Also, the delay circuit 16 comprises the same elements as the delay circuit depicted in FIG. 4.

Wordline driver circuit 243 comprises a precharged NAND device having a PFET precharge device 246 coupled on one side of transistor 250 and an NFET discharge device 252 coupled on the other side of transistor 250. The gate of transistor 250 is coupled to the output of transistors 229. The drain of transistor 250 is coupled to inverter 264, which outputs a wordline signal. PFET clamp devices 244 and 248 regulate the voltages at transistor 250 and inverter 264, respectively. The gates of precharge device 246, and discharge device 252 are coupled to the gates of precharge devices 222, and 233, and the local phase-B clk.

Figure 6:
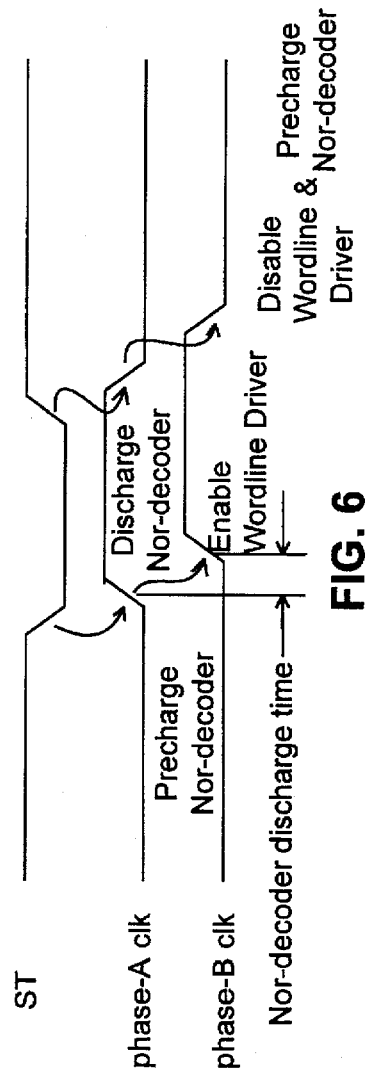
FIG. 6 is a timing diagram of the clock signals of FIG. 1.

As shown in FIG. 6, when the phase-A clk signal is low, phase-B clk precharges the NOR-decoder circuit, and disables the wordline driver circuit. When the phase-A clk signal is switched high, the unselected NOR precharged elements are discharged. The phase-B clk signal is then switched high. When the phase-B clk signal is high, the selected wordline driver is enabled through the discharge transistor on the wordline driver circuit. After the signal ST switches high, the phase-A clk signal switches low, followed by the phase-B clk signal switching low, thus, disabling the wordline driver circuit and precharging the NOR-decoder circuit.

With the disclosed invention, a delayed phase-B clock may be locally-controlled, thus successfully enabling the decoder circuit without regard for memory array size. Furthermore, the wordline driver insures that the precharge and wordline enable will not be active at the same time. At the leading edge of the local phase-B clock, the precharge devices are shut down as the selected wordline is enabled. The discharge of the NOR decoder circuit is enabled solely by the phase-A clock, since the precharge devices are weak and the discharge devices are strong. Conversely, at the trailing edge of the local phase-B clock, the precharge devices are slow, which allow the local phase-B clock to completely disable the wordline driver before the NOR decoder circuit is precharged. This prevents unselected wordline drivers from being enabled at the beginning of precharge when the locally-controlled phase-B clock is in the process of shutting down. Furthermore, phase-A clock may be a generally low capacitance signal because of the generation and operation of the phase-B clock. Thus, this invention provides a precharged wordline decoder that will use a reasonable delay in preventing the possibility of glitches while keeping a generally low capacitance clock signal.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A decoder circuit for decoding an input signal having discharge elements and wordline driver elements, said decoder circuit being coupled to a first clock signal, comprising:
    a first logic circuit receiving said first clock signal for enabling said discharge elements of said first logic circuit;
    a delay circuit for generating a predetermined delayed clock signal from said first clock signal, wherein said delayed clock signal is locally controlled; and
    at least one precharged NAND circuit receiving said delayed clock signal for controlling said wordline driver elements.

2. The circuit of claim 1, wherein said first logic circuit comprises at least one precharged NOR circuit.

3. The circuit of claim 1, wherein the number of said at least one precharged NOR circuit equals the number of said at least one precharged NAND circuit.

4. The circuit of claim 1, wherein said delay circuit is two inverters connected in series.

5. The circuit of claim 1, wherein said at least one precharged NAND circuit is a two-input NAND gate.

6. The circuit of claim 1, wherein said at least one precharged NAND circuit is a three-input NAND gate.

7. A method of decoding an input signal with a decoder circuit comprising the steps of:
    a) generating a first clock signal;
    b) enabling a discharge element of said decoder circuit with said first clock signal;
    c) generating a predetermined, locally-controlled delayed clock signal from said first clock signal;
    d) disabling all precharge elements of said decoder circuit with said delayed clock signal; and
    e) enabling a particular wordline with said delayed clock signal and a selected NAND circuit if said input signal corresponds with said particular wordline.

8. The method of claim 7, wherein step b) further comprises the step of: using said discharge element to discharge at least one NOR circuit.

9. The method of claim 7, wherein step a) further comprises the step of: generating said first clock signal through a single inverter.

10. The method of claim 7, wherein step c) further comprises the step of: generating said delayed clock signal through two inverters coupled in series.

11. A decoder system having a plurality of decoder circuits for decoding a plurality of input signals, said decoder circuits having discharge elements and wordline driver elements, said decoder system being coupled to a pulse signal, comprising:
    a clock circuit receiving said pulse signal for generating a first clock signal;
    a first logic circuit receiving said first clock signal for enabling said discharge elements of said first logic circuit;
    a delay circuit for generating a predetermined delayed clock signal from said first clock signal, wherein said delayed clock signal is locally controlled; and
    at least one precharged NAND circuit receiving said delayed clock signal for controlling said wordline driver elements.

12. The system of claim 11, wherein said first logic circuit comprises at least one precharged NOR circuit.

13. The system of claim 11, wherein said clock circuit is a single inverter.

14. The system of claim 11, wherein said delay circuit is two inverters connected in series.

15. The system of claim 11, wherein said at least one precharged NAND circuit is a two-input NAND gate.

16. The system of claim 11, wherein said at least one precharged NAND circuit is a three-input NAND gate.

17. The system of claim 11, wherein said pulse signal is an internal signal generated by a static random access memory device.

18. A decoder circuit for decoding an input signal having discharge elements and wordline driver elements, said decoder circuit being coupled to a first clock signal, comprising:
    at least one precharged NOR circuit receiving said first clock signal for enabling said discharge elements of said first logic circuit;
    a delay circuit for generating a predetermined delayed clock signal from said first clock signal, wherein said delayed clock signal is locally controlled; and
    at least one precharged NAND circuit receiving said delayed clock signal for controlling said wordline driver elements.

* * * * *